United States Patent
Lee et al.

(10) Patent No.: US 7,147,043 B2
(45) Date of Patent: Dec. 12, 2006

(54) INTEGRATIED LIQUID COOLING SYSTEM FOR ELECTRICAL COMPONENTS

(75) Inventors: Hsieh Kun Lee, Tu-Chen (TW); Cheng-Tien Lai, Tu-chen (TW); Shi Wen Zhou, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/900,815

(22) Filed: Jul. 27, 2004

(65) Prior Publication Data

US 2005/0067150 A1    Mar. 31, 2005

(30) Foreign Application Priority Data

Sep. 26, 2003    (TW) ................. 92217355 U

(51) Int. Cl.
*F28D 15/00*    (2006.01)

(52) U.S. Cl. .................. 165/104.21; 165/104.33; 165/80.3; 361/697; 361/700; 361/704; 174/15.2; 257/714

(58) Field of Classification Search ........... 165/104.33, 165/104.21, 80.4, 185; 361/699, 700, 697, 361/704; 257/715; 174/15.1
See application file for complete search history.

(56) References Cited

U.S. PATENT DOCUMENTS 6,315,033 B1 * 11/2001 Li ..................... 165/104.33
6,439,298 B1 * 8/2002 Li ..................... 165/104.33
6,638,033 B1 * 10/2003 Wang ..................... 417/356
6,702,002 B1 * 3/2004 Wang ..................... 165/80.3

FOREIGN PATENT DOCUMENTS

| CN | ZL98248834.3 | 11/1999 |
| CN | ZL99210734.2 | 4/2000 |
| TW | 459981 | 10/2001 |

* cited by examiner

*Primary Examiner*—Terrell McKinnon
(74) *Attorney, Agent, or Firm*—Wei Te Chung

(57) ABSTRACT

A liquid cooling system includes a cooling body (1) defining an hollow portion receiving a pump (3) and a number of cooling fins (18) therein, and a contact portion for contacting an electrical component. The cooling body defines a passageway therein filled with liquid coolant, and an inlet (124) and an outlet (125) both in communication with the passageway. The pump defines an exit (31) and an entrance (32) connected to the inlet and the outlet of the cooling body respectively by two tubes (5). Heat is transferred from the electrical component to the contact portion, and then conducted to the coolant, and conducted to other portions of the cooling body as the coolant flows through the passageway. The heat is then conducted to the cooling fins for dissipation.

21 Claims, 5 Drawing Sheets

INTEGRATIED LIQUID COOLING SYSTEM FOR ELECTRICAL COMPONENTS

BACKGROUND OF THE INVENTION

1. Field of the Invention

The present invention relates generally to cooling systems, and more particularly to a liquid cooling system for rapidly cooling an electrical component such as a Central Processing Unit (CPU).

2. Prior Art

With the continuing development of computer electronics technology, new electronic packages such as the latest CPUs can perform more and more functions. Heat generated by these modem electronic packages has increased commensurately. The heat must be removed from the CPUs to prevent them becoming unstable or being damaged. The traditional cooling means such as combined heat sinks and cooling fans are increasingly unable to provide satisfactory cooling performance. Under such circumstances, cooling system using liquid cooling technology is thus developed for cooling the CPUs.

Chinese patent numbers 98248834.3 and 99210734.2 respectively disclose such a kind of cooling system. This kind of cooling system generally comprises a cooling base contact the CPU for absorbing heat generated by the CPU. The cooling base generally defines a cavity for receiving liquid coolant therein, and an inlet and an outlet both in communication with the cavity. The cooling system also comprises a heat sink and a pump arranged at proper places within a computer enclosure. A first tube connects the inlet of the cooling base and the pump, so that the coolant enters the cavity along the first tube. A second tube connects the outlet of the cooling base and the pump, so that the heated coolant exits from the cavity along the second tube. The second tube extends through the heat sink, whereupon heat of the heated coolant is transferred to the heat sink to radiate to ambient air. Thus, the heat of the CPU is continuously taken away by circulation of the coolant.

However, the cooling base, the tubes, the heat sink, and the pump are discrete components prior to attachment within the computer enclosure. Installation and removal of the cooling system can be troublesome and problematic. In addition, a large space for receiving these discrete components is required. This militates against the trend of electrical devices becoming more and more smaller.

SUMMARY OF THE INVENTION

Accordingly, an object of the present invention is to provide a liquid cooling system which occupies a relatively small space.

Another object of the present invention is to provide a liquid cooling system which can be readily installed or removed to or from an electrical enclosure.

To achieve the above-mentioned objects, a liquid cooling system in accordance with a preferred embodiment of the present invention comprises a cooling body defining a hollow portion, and a contact portion for contacting an electrical component for absorbing the heat generated by the electrical component, a pump located in the hollow portion of the cooling body, and a plurality of cooling fins arranged in the hollow portion. The cooling body defines a passageway therein filled with liquid coolant, and an inlet and an outlet both in communication with the passageway. The pump defines an exit connected to the inlet by a tube, and an entrance connected to the outlet by another tube. The heat is transferred from the electrical component to the contact portion, and then conducted to the coolant, and conducted to other portions of the cooling body as the coolant flows through the passageway. The heat is then conducted to the cooling fins for dissipation.

Other objects, advantages and novel features of the present invention will be drawn from the following detailed description of the preferred embodiment of the present invention with attached drawings, in which:

DESCRIPTION OF THE PREFERRED EMBODIMENTS

Figure 1:
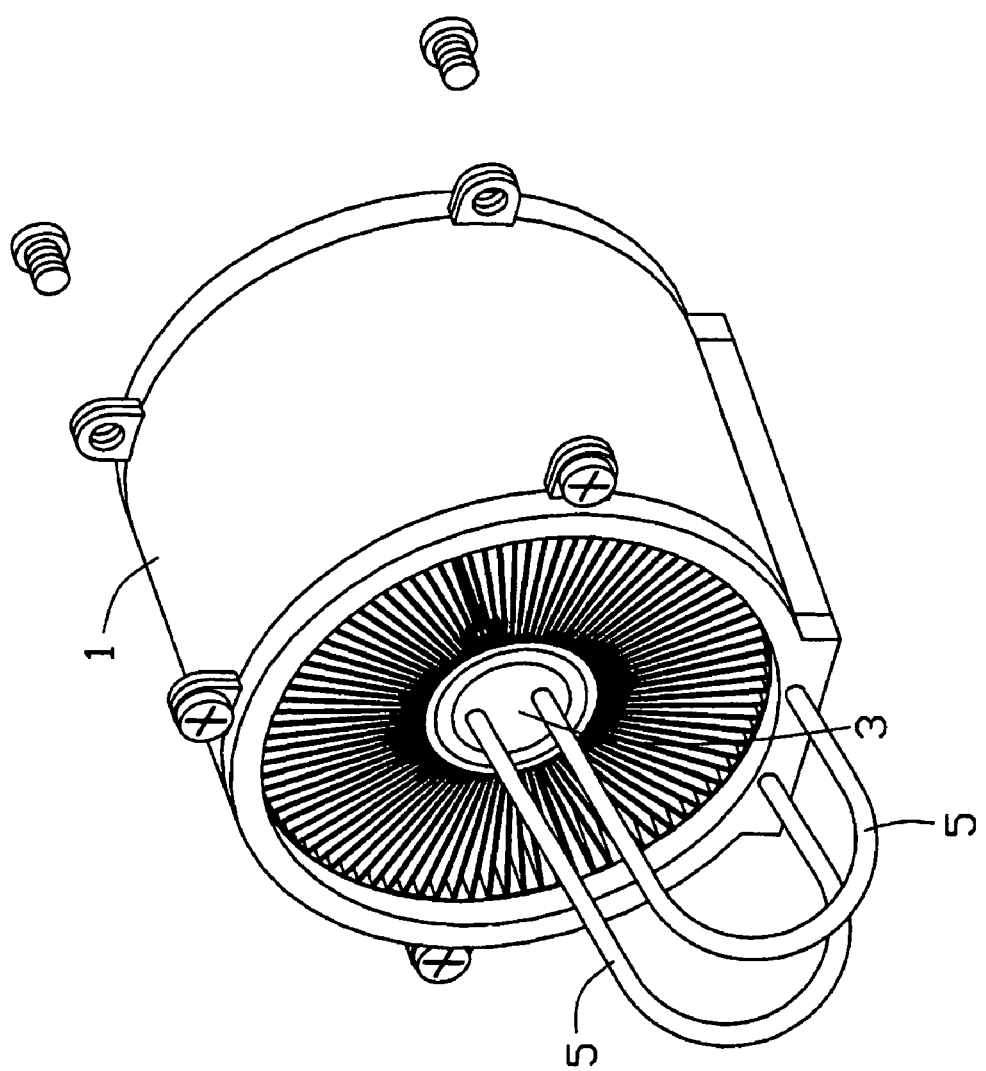
FIG. 1 is an assembled, isometric view of a liquid cooling system in accordance with the preferred embodiment of the present invention, the liquid cooling system comprising a cooling body, a pump, and two tubes connecting the cooling body to the pump.

FIG. 1 illustrates a liquid cooling system in accordance with a preferred embodiment of the present invention. The liquid cooling system comprises a cooling body 1, a pump 3 mounted within the cooling body 1, and two tubes 5 connecting the cooling body 1 to the pump 3.

Figure 2:
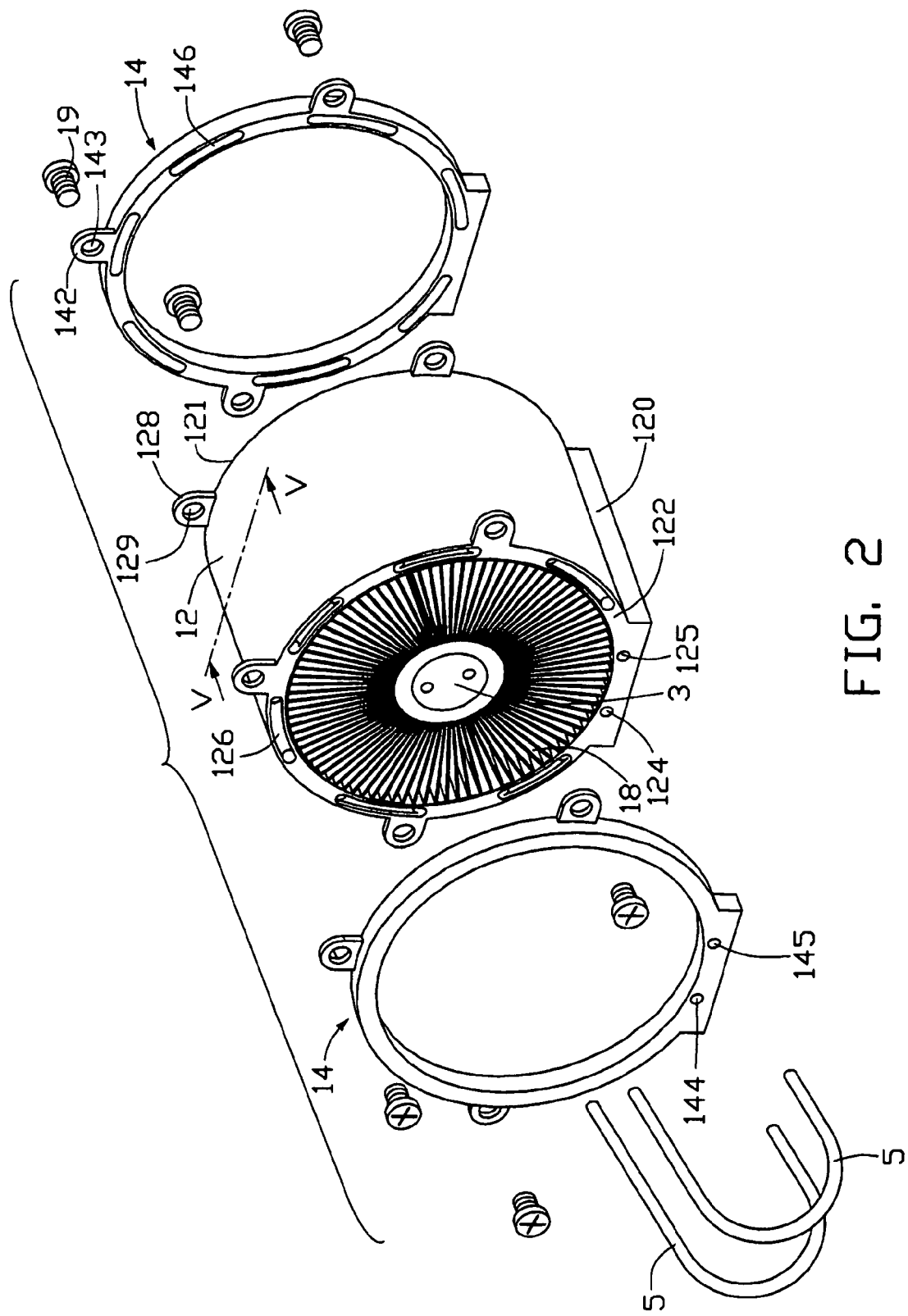
FIG. 2 is an exploded, isometric view of the liquid cooling system of FIG. 1, the cooling body of the liquid cooling system comprising a cylinder having opposite first end second ends, and two end lids for being attached to the first and second ends respectively.

Referring to FIG. 2, the cooling body 1 comprises a cylinder 12 having opposite first and second ends 121, 122, and a pair of end lids 14 hermetically attached to the first and second ends 121, 122 of the cylinder 12 respectively. In the preferred embodiment, the end lids 14 are attached to the cylinder 12 by means of riveting. That is, the cylinder 12 forms a plurality of first mounting tabs 128 each defining a first mounting hole 129 at the first and second ends 121, 122 thereof, each end lid 14 forms a plurality of second mounting tabs 142 each defining a second mounting hole 143, a plurality of rivets 19 extends through corresponding pairs of first and second mounting hole 129, 143 respectively, and ends of the rivets 19 are hammered thereby connecting the end lids 14 to the cylinder 12. Alternatively, other suitable means such as soldering can be used for connecting the end lids 14 and the cylinder 12.

Figure 4:
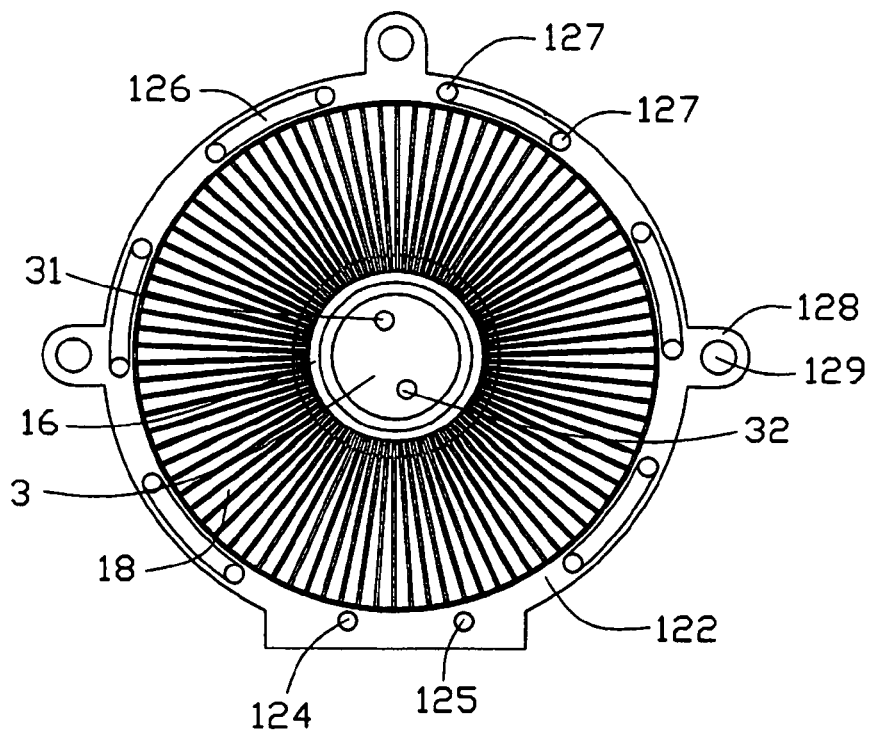
FIG. 4 is a left side elevational view of the cylinder of the cooling body and the pump of the liquid cooling system of FIG. 2.

The cylinder 12 comprises a circumferential wall with an inner periphery and an outer periphery. The inner periphery of the cylinder 12 defines a hollow space therebetween. The cylinder 12 comprises a flat contact portion 122 at the outer periphery thereof, for contacting an electrical component such as a Central Processing Unit (CPU) thereby absorbing heat generated by the CPU. Referring also to FIG. 4, a mounting bracket 16 is located at a center portion of the hollow space of the cylinder 12, and the pump 3 is mounted in the mounting bracket 16. The pump 3 has an exit 31 and an entrance 32. A plurality of cooling fins 18 extends radially from an outer periphery of the mounting bracket 16 to the inner periphery of the cylinder 12.

Figure 3:
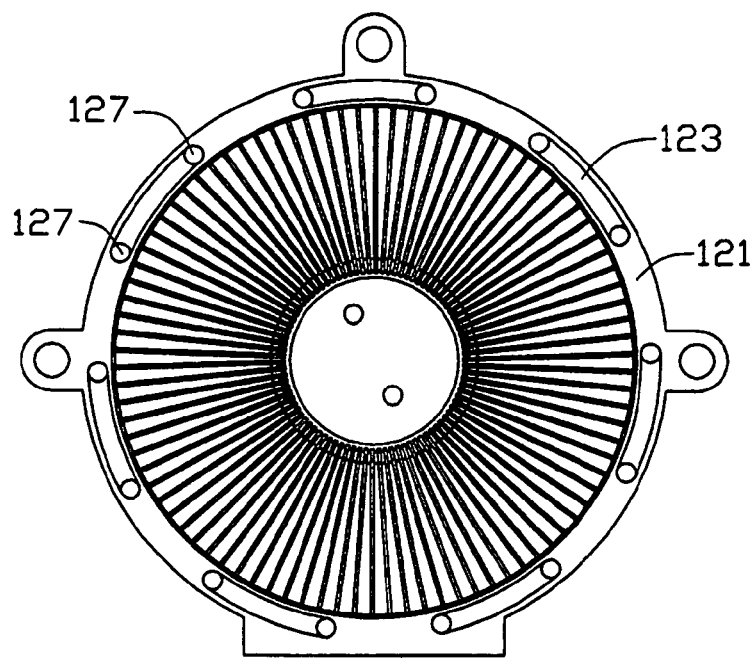
FIG. 3 is a right side elevational view of the cylinder of the cooling body and the pump of the liquid cooling system of FIG. 2.
Figure 5:
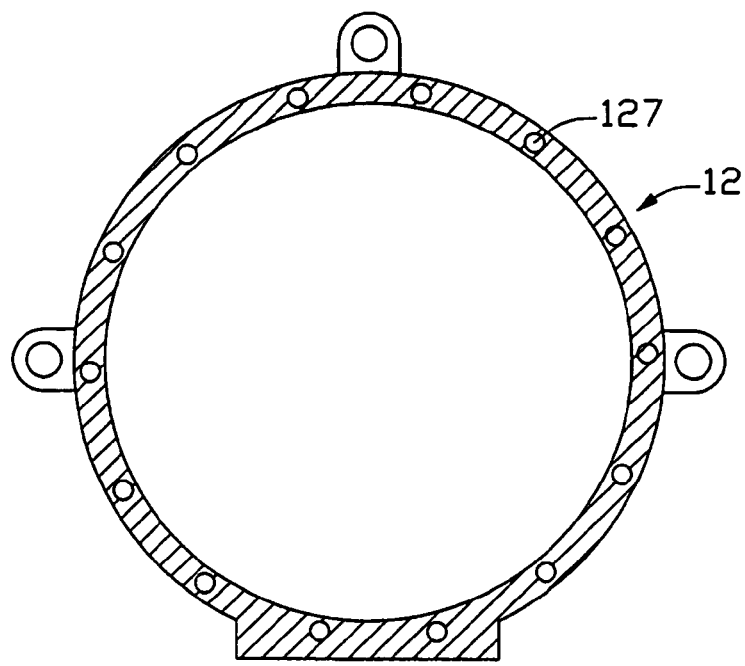
FIG. 5 is a cross-sectional view of the cylinder of the cooling body of the liquid cooling system of FIG. 2, corresponding to line V—V thereof.

Referring to FIGS. 3 through 5, a plurality of parallel channels 127 is defined in the cylinder 12, spanning from the first end 121 to the second end 122 thereof. The channels 127 are parallel to a central axis of the cylinder 12. In the preferred embodiment, there is an even number of channels 127 defined in the cylinder 12. Therefore, the channels 127 can be arranged into several pairs containing adjacent channels 127. A first groove 123 is defined circumferentially in the first end 121 of the cylinder 12, between each pair of channels 127, so that the channels 127 of each pair communicate with one another at the first end 121 of the cylinder 12. A second groove 126 is defined circumferentially in the second end 122 of the cylinder 12, between two adjacent channels 127 of any two adjacent pairs of channels 127 except for the pair of channels 127 which is nearest the contact portion 120, so that any adjacent pairs of channels 127 communicate with one another at the second end 122 of the cylinder 12. Viewed from the first end 121 to the second end 122 of the cylinder 12, the first grooves 123 and the second grooves 126 are essentially circumferentially alternately arranged with each other while at the first and second ends 121, 122 of the cylinder 12 respectively. The cylinder 12 defines an inlet 124 and an outlet 125 at the second end 122 thereof, in communication with respective ones of said pair of channels 127 nearest the contact portion 120. When the end lids 14 are mounted to the cylinder 12, a zigzagged passage is thereby defined in the cooling body 1 between the inlet 124 and the outlet 125, for flow of coolant from the inlet 124 to the outlet 125.

One tube 5 connects the exit 31 of the pump 3 and the inlet 124 of the cylinder 12, and the other tube 5 connects the entrance 32 of the pump 3 and the outlet 125 of the cylinder 12, thereby forming a cycle loop together with the passageway, for circulation of coolant.

In operation of the liquid cooling system, heat is transferred from the CPU to the contact portion 120 of the cylinder 12 of the cooling body 1, and then conducted to the coolant. The heat is then transferred from the coolant to other portions of the cylinder 12 as the coolant flows through the passageway of the cooling body 1. The heat is then conducted to the cooling fins 18, whereupon the heat is radiated to ambient air. Circulation of the coolant continuously takes the heat away from the contact portion 120 and conducts the heat to the other portions of the cylinder 12. During this course, the contact portion 120 absorbs the heat from the CPU, and the other portions of the cylinder 12 and the cooling fins 18 dissipate the heat to the ambient air. Because the cylinder 12 and the cooling fins 18 have relatively large surface areas, the heat of the CPU can be rapidly radiated to the ambient air.

In the present invention, the cooling fins 18, the cooling body 1, and the pump 3 of the liquid cooling system are greatly integrated. Therefore, installation or removal of the liquid cooling system is simplified. In addition, the space required to install the cooling system is accordingly reduced.

As seen in FIG. 4, in the preferred embodiment, the inlet 124 and outlet 125 communicate with the respective ones of said pair of channels 127 nearest the contact portion 120 and are disposed near the contact portion 120. Thus, said pair of channels 127 nearest the contact portion 120 function as a "coolant input channel" and a "coolant output channel" respectively. In alternative embodiments, another pair of channels 127 is selected to function as the "coolant input channel" and the "coolant output channel" respectively. Accordingly, the inlet 124 and the outlet 25 in accordance with the alternative embodiments communicate with said another pair of channels 127 respectively.

Referring back to FIG. 2, a plurality of third grooves 146 is defined in the end lids 14, corresponding to the first and second grooves 123, 126 respectively. The third grooves 146 widen the passageway at the first and second ends 121, 122 of the cylinder 12. This can allow the coolant to flow smoother. A pair of through holes 144, 145 is defined in the end lids 14, in communication with the inlet 124 and outlet 125 of the cylinder 12.

Figure 6:
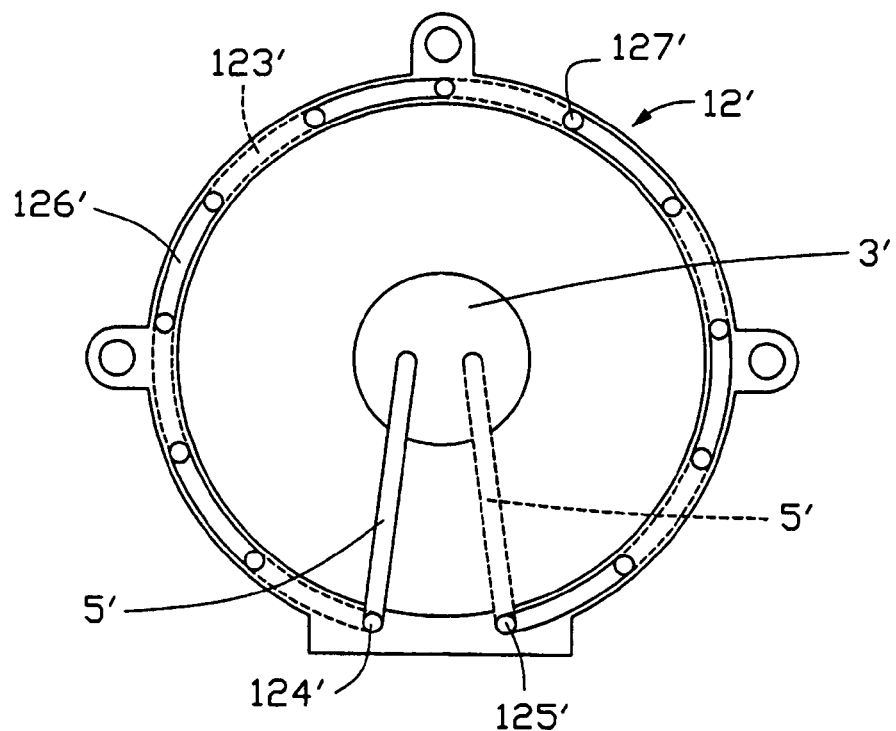
FIG. 6 is a schematic, side elevational view of a cylinder of a cooling body and a pump of a liquid cooling system in accordance with an alternative embodiment of the present invention.

In the preferred embodiment, the cylinder 12 defines an even number of channels 127 therein. Referring to FIG. 6, a cylinder 12' in accordance with an alternative embodiment defines an odd number of channels 127' therein. The cylinder 12' defines a plurality of first and second grooves 123', 126' in opposite ends thereof in a same manner with that of the preferred embodiment. That is, the first grooves 123' and the second grooves 126' are essentially circumferentially alternately arranged with each other while at opposite ends of the cylinder 12' respectively. An inlet 124' and an outlet 125' are defined in the cylinder 12' at said opposite ends respectively. A pump 3' is mounted within the cylinder 12', and defines an exit (not labeled) and an entrance (not labeled) at opposite ends thereof. A pair of tubes 5' is located at opposite ends of the cylinder 12' respectively and connects the exit of the pump 3' to the inlet 124' of the cylinder 12', and connects the entrance of the pump 3' to the outlet 125' of the cylinder 12'.

Figure 7:
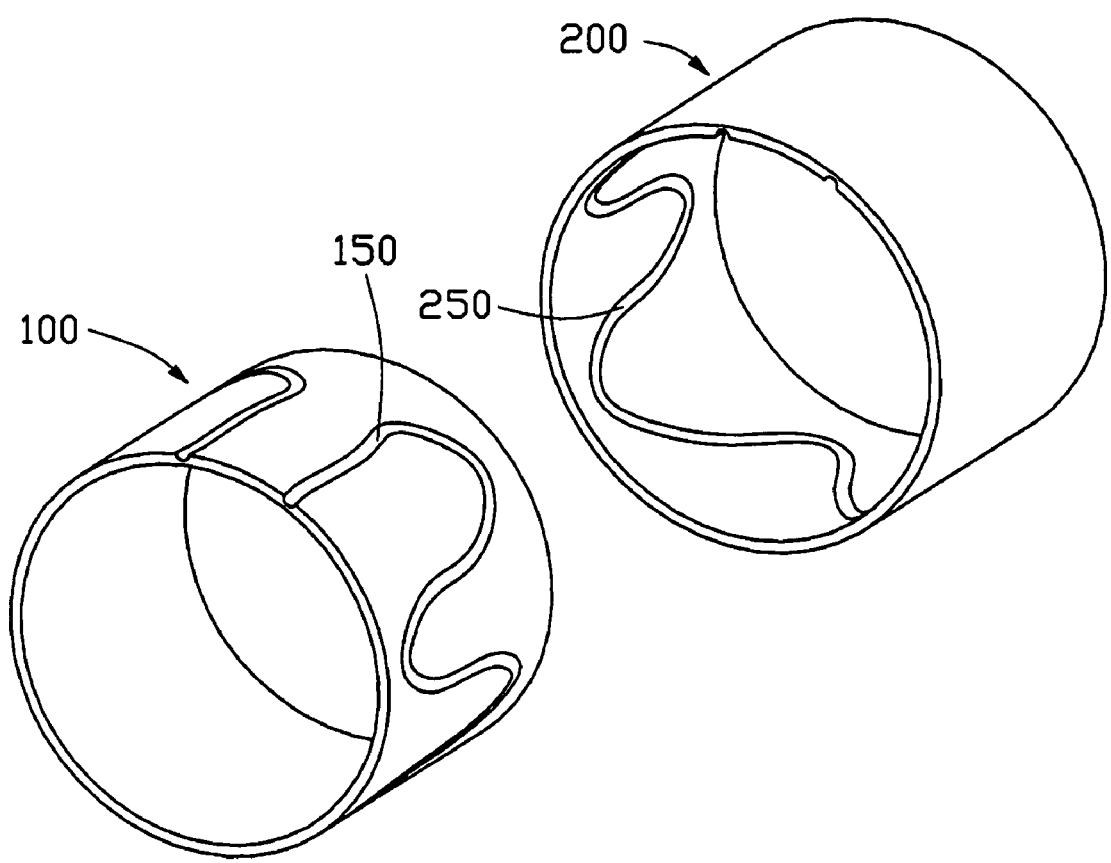
FIG. 7 is an exploded, isometric view of a cooling body of a liquid cooling system in accordance with a further alternative embodiment of the present invention.

FIG. 7 shows a cooling body 1' of the liquid cooling system in accordance with a further alternative embodiment of the present invention. The cooling body 1' comprises an inner cylinder 100, and an outer cylinder 200 surrounding the inner cylinder 100. A serpentine first channel 150 is defined in an outer periphery of the inner cylinder 100. A serpentine second channel 250 is defined in an inner periphery of the outer cylinder 200, corresponding to the first channel 150. Once the outer cylinder 200 surrounds the inner cylinder 100, a passageway is defined in the cooling body 1' along the first channel 150 and the second channel 250, for flow of the coolant. Understandably, to form the passageway for flow of the coolant, it is not necessary for both the inner cylinder 100 and the outer cylinder 200 to form the first and second channels 150. 250 respectively.

It is understood that the invention may be embodied in other forms without departing from the spirit thereof. The above-described examples and embodiments are to be considered in all respects as illustrative and not restrictive, and the invention is not to be limited to the details given above.

The invention claimed is:

1. A liquid cooling system for dissipating heat generated by an electrical component, the liquid cooling system comprising:
    a cooling body defining a passageway filled with liquid coolant, and an inlet and an outlet both in communication with the passageway, the cooling body comprising a cylinder with a hollow portion therein and a plurality of first mounting tabs extending from opposite first and second ends thereof, and first and second lids being hermetically attached to the first and second ends, respectively, and having a plurality of second mounting tabs engaged with the first mounting tabs of the cylinder;

a pump located at the hollow portion, the pump defining an exit connected to the inlet by a tube, and an entrance connected to the outlet by another tube, thereby forming a cycle loop together with the passageway; and a plurality of cooling fins arranged at the hollow portion; wherein the coolant is capable of transferring the heat from the contact portion to other portions of the cooling body via flowing in the passageway, and the heat is then conducted to the cooling fins for dissipation.

2. The liquid cooling system as described in claim 1, wherein the passageway is zigzagged, portions of the passageway are defined in a circumferential wall of the cylinder, and other portions of the passageway are defined at the first and second ends.

3. The liquid cooling system as described in claim 2, wherein said portions of the passageway are a plurality of channels parallel to a central axis of the cylinder and said other portions of the passageway are a plurality of first and second grooves, the first grooves are defined in at least one of end faces of the first end and its corresponding lid, and the second grooves are defined in at least one of end faces of the second end and its corresponding lid.

4. The liquid cooling system as described in claim 3, wherein each of the channels communicates with one of the first grooves at the first end, and communicates with one of the second grooves at the second end.

5. The liquid cooling system as described in claim 4, wherein the inlet and outlet communicate with two adjacent channels respectively.

6. The liquid cooling system as described in claim 1, wherein the cooling body further comprises outer cylinder hermetically surrounding said cylinder.

7. The liquid cooling system as described in claim 6, wherein the passageway is serpentinely defined between the cylinder and the outer cylinder.

8. The liquid cooling system as described in claim 7, wherein the passageway is defined in at least one of an outer periphery of the cylinder and an inner periphery of the outer cylinder.

9. The liquid cooling system as described in claim 1, wherein a mounting bracket is arranged in the hollow portion, and the pump is located in the mounting bracket.

10. The liquid cooling system as described in claim 9, wherein the cooling fins extend radially from the mounting bracket to an outmost periphery of the hollow portion.

11. A liquid cooling system comprising:

a cooling body comprising a heat absorbing portion adapted for contacting a heat generating device, and a heat dissipation portion comprising an inner periphery and an outer periphery thereof, the inner periphery defining a hollow space therebetween, the heat dissipation portion defining a passageway between the inner periphery and the outer periphery surrounding the hollow space, and an inlet an outlet in communication with the passageway, first and second lids being hermetically attached to two ends of the heat dissipation portion via a plurality of first and second mounting tabs respectively extending from the lids and the heat dissipation portion; and a pump located in said hollow space, and defining an exit in flow communication with the inlet, and an entrance in flow communication with the outlet; wherein heat is continuously transferred form the heat absorbing portion to the heat dissipation portion of the cooling body by circulation of coolant in the passageway.

12. The liquid cooling system as described in claim 11, wherein the heat dissipation portion of the cooling body comprises a cylinder having opposite first and second ends, and the first and second lids hermetically attached to the first and second ends respectively, and said hollow space is defined within said cylinder.

13. The liquid cooling system as described in claim 12, wherein the passageway is zigzagged, portion of the passageway are a plurality of channels defined in a circumferential wall of the cylinder, and other portions of the passageway are a plurality of first and second grooves defined at the first and second ends respectively.

14. The liquid cooling system as described in claim 13, wherein each of the channels communicates with one of the first grooves at the first end, and communicates with one of the second grooves at the second end.

15. The liquid cooling system as described in claim 11, wherein the heat dissipation portion of the cooling body comprises an inner cylinder, and an outer cylinder hermetically surrounding the inner cylinder.

16. The liquid cooling system as described in claim 15, wherein the passageway is serpentinely defined between the inner cylinder and the outer cylinder.

17. The liquid cooling system as described in claim 11, wherein the cooling body further comprises a plurality of cooling fins attached to the inner periphery thereof.

18. The liquid cooling system as described in claim 13, wherein the first grooves are defined in at least one of end faces of the first end and a corresponding first lid, the second grooves are defined in at least one of end faces of the second end and a corresponding second lid.

19. A liquid cooling system comprising:

a cylinder comprising first and second ends, a heat receiving portion located between the first and second ends, coolant input and output channels adjacent to the heat receiving portion, and a plurality of serpentine transfer channels in a circumferential wall of the cylinder away from the heat receiving portion, the first and second ends having first and second lids attached thereto, respectively, a plurality of first grooves being defined between end faces of the first end and the first lid and communicating with the transfer channels, a plurality of second grooves being defined between end faces of the second end and the second lid and communicating with the transfer channels;

a core located in a center of the cylinder;

a pair of pipes connecting the core and the input and output channels;

wherein the core, the pipes, the coolant input and output channels, the transfer channels and the first and second grooves cooperatively form a passageway, and liquid coolant is filled in the passageway.

20. The liquid cooling system as described in claim 19, wherein a pump is located in the core and drives the liquid coolant to flow from the coolant input channel to the coolant output channel along the passageway.

21. The liquid cooling system as described in claim 19, further comprising a plurality of cooling fins arranged between the core and the circumferential wall of the cylinder.

* * * * *